(12) United States Patent
Wilson et al.

(10) Patent No.: US 7,668,214 B2
(45) Date of Patent: Feb. 23, 2010

(54) LIGHT SOURCE

(75) Inventors: Gordon Wilson, San Francisco, CA (US); Xiangdong Qiu, Cupertino, CA (US); YuZhong Dai, Cupertino, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 94 days.

(21) Appl. No.: 12/116,834

(22) Filed: May 7, 2008

(65) Prior Publication Data

US 2008/0310027 A1 Dec. 18, 2008

Related U.S. Application Data

(60) Provisional application No. 60/934,320, filed on Jun. 12, 2007.

(51) Int. Cl.
*H01S 3/10* (2006.01)
(52) U.S. Cl. .................. 372/23; 372/50.23; 372/101
(58) Field of Classification Search .............. 372/23, 372/50.23
See application file for complete search history.

(56) References Cited

U.S. PATENT DOCUMENTS

| | | | |
|---|---|---|---|
| 3,396,344 A | 8/1968 | Broom .................. 331/94.5 |
| 4,828,357 A | 5/1989 | Arata et al. ............... 359/853 |
| 5,048,911 A | 9/1991 | Sang et al. ................ 385/33 |
| 5,081,637 A | 1/1992 | Fan et al. .................. 372/72 |
| 5,185,758 A | 2/1993 | Fan et al. .................. 372/72 |
| 5,268,978 A | 12/1993 | Po et al. .................... 385/33 |
| 5,319,528 A | 6/1994 | Raven ..................... 362/553 |
| 5,418,880 A * | 5/1995 | Lewis et al. ............... 385/123 |
| 5,463,534 A | 10/1995 | Raven ..................... 362/553 |
| 6,005,717 A | 12/1999 | Neuberger et al. .......... 359/619 |
| 6,044,096 A | 3/2000 | Wolak et al. ................ 372/36 |
| 6,075,912 A | 6/2000 | Goodman .................. 385/33 |
| 6,124,973 A | 9/2000 | Du et al. .................... 359/618 |
| 6,151,342 A | 11/2000 | Nightingale et al. .......... 372/36 |
| 6,229,831 B1 | 5/2001 | Nightingale et al. .......... 372/36 |
| 6,324,320 B1 | 11/2001 | Goodman .................. 385/33 |
| 6,337,873 B1 * | 1/2002 | Goering et al. .............. 372/69 |
| 6,898,222 B2 | 5/2005 | Hennig et al. ............... 372/36 |
| 2006/0018356 A1 | 1/2006 | Voss et al. ................ 372/50.12 |
| 2006/0222298 A1 | 10/2006 | Hatori ..................... 385/43 |
| 2007/0036482 A1 | 2/2007 | Goncharov et al. .......... 385/24 |
| 2007/0116077 A1 | 5/2007 | Farmer et al. ............ 372/50.12 |
| 2007/0195850 A1 | 8/2007 | Schluter et al. ......... 372/50.124 |

FOREIGN PATENT DOCUMENTS

| | | |
|---|---|---|
| EP | 0541658 | 5/1993 |
| WO | 02/50599 | 6/2002 |
| WO | 2007/019878 | 2/2007 |

* cited by examiner

*Primary Examiner*—Dung T Nguyen
(74) *Attorney, Agent, or Firm*—Matthew A. Pequignot; Pequignot + Myers LLC (57) ABSTRACT

An apparatus for coupling radiation of individual laser diode emitters into a common optical fiber is disclosed. The radiation is collimated along fast axis and combined by using crossed pairs of flat mirrors. The combined beams are collimated by a common slow axis collimating lens. The laser diode emitters are disposed on both sides of an optical axis of the slow axis collimating lens such that the optical path lengths from the emitters to the slow axis collimating lens are equal.

24 Claims, 7 Drawing Sheets

FIG. 6

# LIGHT SOURCE

CROSS-REFERENCE TO RELATED APPLICATIONS

The present invention claims priority from U.S. Patent Application No. 60/934,320 filed Jun. 12, 2007, entitled "Packaging Of Multiple Laser Diodes Into A Single Package", by Wilson et al., which is incorporated herein by reference for all purposes.

TECHNICAL FIELD

The present invention is related to optomechanical packaging of semiconductor laser diodes, or more specifically, to packaging of multiple laser diode chips into a single diode laser assembly so as to provide a light source having a single output of optical radiation, which can be fiber coupled or collimated.

BACKGROUND OF THE INVENTION

Semiconductor laser diodes, manufactured as single emitter lasers or a laser diode bars, may have an electrical-to-optical conversion efficiency reaching 50% and higher, and can presently achieve optical power levels of a few Watts or even tens of Watts per a single emitter laser diode, and tens to hundreds of Watts per a laser diode bar. Due to high efficiency, reasonable power levels, and high spectral and directional brightness, laser diodes and laser diode bars find applications in many areas, such as material processing, offset printing, medical treatment, pumping of solid state lasers, and particularly pumping of fiber lasers.

There are two important considerations related to packaging of laser diodes into a single package. A first of these considerations is heat sinking. Laser diodes, in operation, generate considerable amounts of heat, since not all of the electrical energy used to power the laser diodes is converted into optical energy. The non-converted energy is released as heat. At an efficiency of 50% and optical power level of 5 W, for example, a single laser diode emitter will generate 5 W of heat. The heat needs to be removed so as to ensure stable and reliable laser diode operation. Moreover, since the central wavelength of laser radiation depends on laser chip temperature, the latter often needs to be stabilized with a typical accuracy of about one degree Celsius.

The second important consideration related to packaging is optical coupling. Due to a thin-slab geometry of laser diodes, their radiation, propagating along Z-axis, has a highly asymmetric lateral distribution of optical power density and divergence along X- and Y-axes. Assuming a standard notation of an X-axis lying in the plane of the laser diode slab, a Y-divergence of a laser diode is typically much higher than an X-divergence and is almost diffraction limited, whereas the X-divergence of a laser diode is usually smaller and is not diffraction limited. Such an asymmetry of laser diode beam poses a certain difficulty in applications where a symmetric, round beam is required, for example in applications involving coupling of radiation of many laser diodes into an end of a single optical fiber. Since an optical fiber generally has a substantially circular or polygonal cross-section and has a substantially symmetrical acceptance angle, the combined radiation of a diode laser has to be symmetric in its divergence and lateral power density distribution, in order to couple as much light into an optical fiber as possible.

A variety of ways of solving both abovementioned design considerations have been suggested in the prior art. For example in order to provide heat sinking, the laser diodes or laser diode bars of a diode laser apparatus are typically placed onto a common heat sink or stacked together. Even though stacking provides certain advantages, such as a simpler and more compact optical arrangement, it is not as efficient as a common heat sink. In a stacking arrangement, heat flows in a serial fashion, whereas when a common heat sink is provided, heat flows in a parallel fashion allowing more heat to be removed. On the other hand, a common heat sink method often results in bulky and inefficient coupling optics. For example, one prior art apparatus uses a complex multi-faceted reflector to combine beams from individual laser diode chips. The resulting device is expensive and difficult to align. Other prior art designs use waveguides or complex stair-like heat sink structures and microlenses combined with multi-faceted reflectors, which are utilized to combine the individual beams of laser diodes into a symmetrical output beam.

One important type of laser diode assembly is a single-bar assembly. In a single bar of laser diode emitters, the latter are formed on a common semiconductor substrate, side-by-side, and therefore allow for a parallel heat flow towards the common substrate to occur. Since the lateral position of individual emitters in a bar is precisely defined using photolithography, a simple and reliable pre-manufactured set of micro-optics can be used to collimate and reformat the output laser beam. In diode lasers made this way, a few tens of Watts of output power can be easily generated and coupled into an optical fiber. However, other problems such as warping, or so called smile of a bar, come into play reducing fiber coupling efficiency and device reliability; furthermore, it is not very easy to remove heat from individual emitters disposed with a sub-millimeter pitch on the common semiconductor substrate. There is also a reliability concern related specifically to single-bar diode lasers: when a single laser diode emitter fails catastrophically in a bar e.g. due to an electrical short, it often disables its neighboring emitters, failing the entire single-bar diode laser.

While there are many specific geometries presently available to package laser diodes into an assembly, it is clear that a successful device will naturally combine efficient heat removal from individual laser diode emitters with a simple, inexpensive, easy to align set of optics for reformatting highly asymmetrical anamorphic beams from individual emitters into a low aspect ratio, single optical beam suitable for optical fiber coupling, material processing, and a multitude of other tasks.

It is, therefore, an object of the present invention to provide an inexpensive and compact, fiber or free space coupled light source, for pumping fiber lasers and solid state lasers, material processing, medical treatment, offset printing applications, and the like.

SUMMARY OF THE INVENTION

In accordance with the present invention, there is provided a light source comprising:

a plurality of planar emitters for emitting light, wherein an emission of each said emitter is characterized by a slow-axis divergence and a fast-axis divergence;

a plurality of fast-axis collimating means, one per each emitter, for collimating the emission of each emitter into a fast-axis collimated beam, wherein said fast-axis collimated beam continues to diverge in a slow-axis divergence plane;

a slow axis collimating means, disposed downstream of the fast-axis collimating means, for collimating the fast-axis collimated beams into a single collimated beam; and a plurality of redirecting means, for redirecting the fast-axis collimated beams, so as to couple said fast-axis collimated beams to the slow axis collimating means such that:

the fast-axis collimated beams are substantially parallel to each other and to an optical axis of the slow axis collimating means, the slow-axis divergence planes of the fast-axis collimated beams are substantially parallel to each other, and optical path lengths from the planar emitters to the slow axis collimating means are substantially equal.

In accordance with another embodiment of the present invention, there is further provided a package of planar anamorphic emitters, comprising:

a two-emitter optical unit having first and second planar anamorphic emitters for emitting light, wherein the planes of said planar anamorphic emitters are oriented parallel to each other, and the first and the second emitters emit first and second beams, respectively, towards each other, and the first and second beams have a fast-axis divergence and a slow-axis divergence;

first and second fast axis collimating means, optically coupled to said first and second emitters, respectively, for substantially minimizing the fast-axis divergence of the beams emitted by the emitters, so as to produce first and second fast-axis collimated beams propagating towards each other; and first and second flat mirrors, optically coupled to said first and second fast axis collimating means, respectively, for re-directing the first and the second fast-axis collimated beams, so as to cause said beams to propagate in a same direction and parallel to each other;

a slow axis collimating means, disposed downstream of the two-emitter optical unit and optically coupled to both the first and the second fast-axis collimated beams of said two-emitter optical unit, for substantially minimizing the slow-axis divergence of the first and the second beams, so as to produce a collimated beam of light.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Like numbers refer to like elements in FIGS. 2 to 5.

Figure 1:
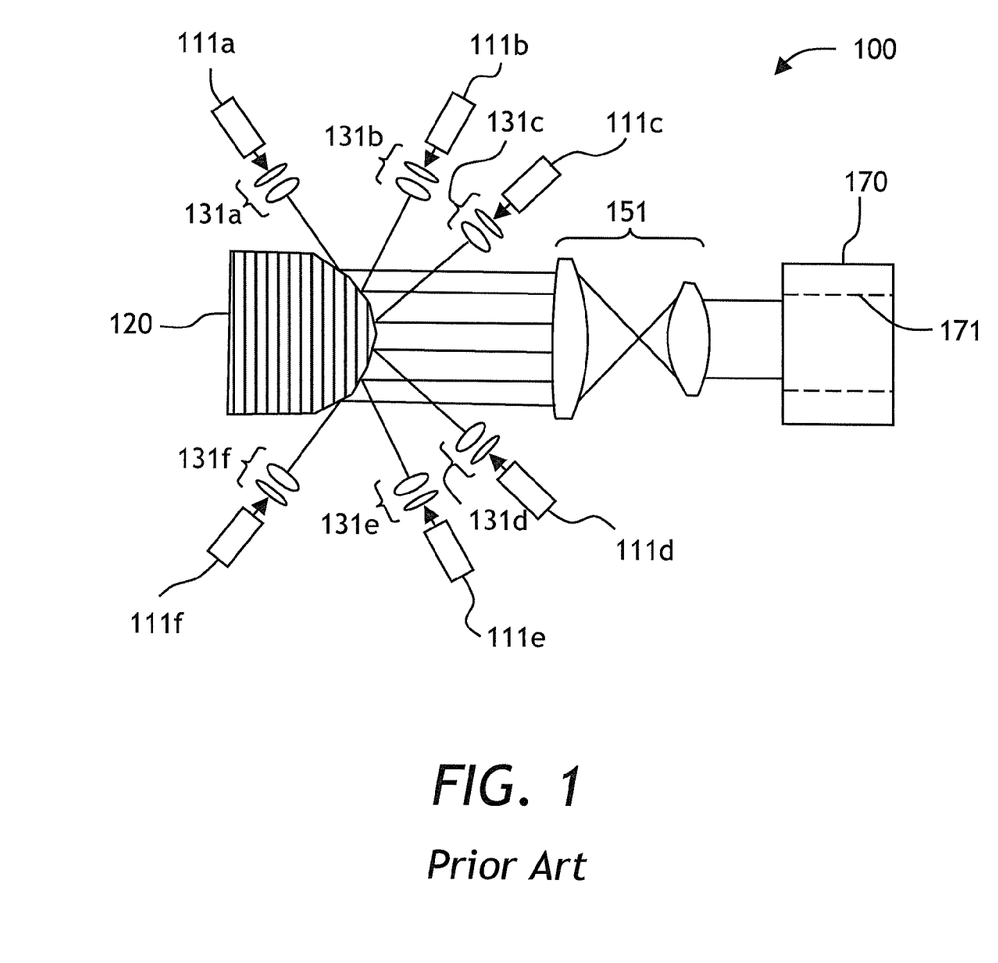
FIG. 1 illustrates an example of a prior-art individual laser chips placement and beam combining optics.

Referring now to FIG. 1, a layout is shown of a prior art apparatus 100 for coupling radiation beams into an optical fiber. The apparatus 100 is comprised of individual laser diode emitter chips 111$a$-111$f$, each having coupled thereto a set of collimating micro-optics 131$a$-131$f$, a multi-faceted redirecting mirror, or unitary deflector 120, focusing optics 151, and an output optical fiber 170 having a cladding 171. In operation, the emitting apertures of the emitter chips 111$a$-111$f$ are imaged by an a focal relay optical system onto a unitary deflector 120 which redirects the radiation towards a common output a focal relay system 151 which couples the radiation from emitters 111$a$-111$f$ into cladding 171 of output fiber 170.

Even though the apparatus of FIG. 1 allows for heat sinking the individual laser emitters 111$a$-111$f$ to a common plate, the optical components required to reformat and couple the radiation from individual emitters 111$a$-111$f$ into cladding 171 of fiber 170 are quite complex and difficult to align, since the unitary deflector 120 does not allow for individual adjustment of its reflective surfaces, and each laser diode emitting chip 111$a$-111$f$ has associated set of micro-optics 131$a$-131$f$ requiring precise adjustment due to a short focal length of the microlenses 131$a$-131$f$. Other configurations for combining individual laser emitters into a common output fiber exist in the prior art and include, for example, a concave mirror in place of unitary deflector 120, a complex stair-like reflector arrangements, or waveguide structures coupled to individual emitters within the single package of the multi-emitter diode laser.

Figure 2A:
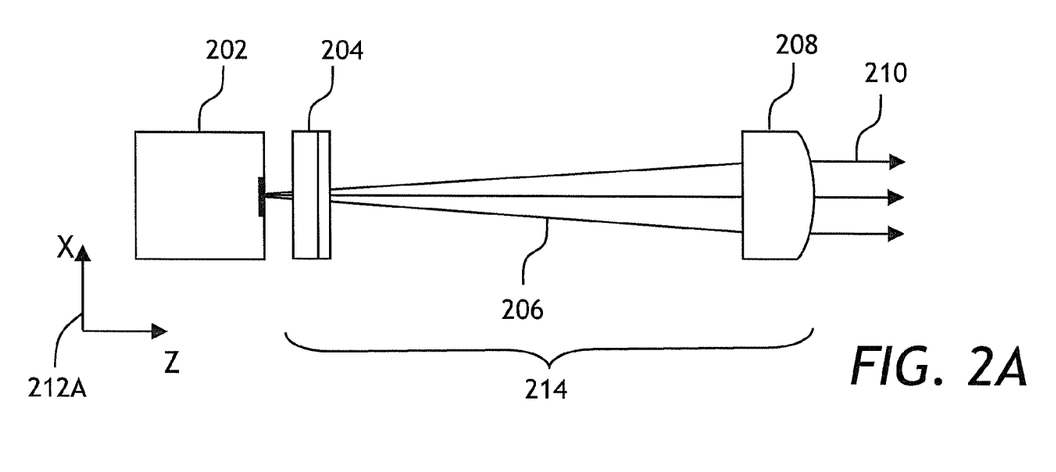
FIGS. 2A, 2B are schematic views of a two-lens anamorphic telescope for collimating radiation from an individual laser diode emitter.
Figure 2B:
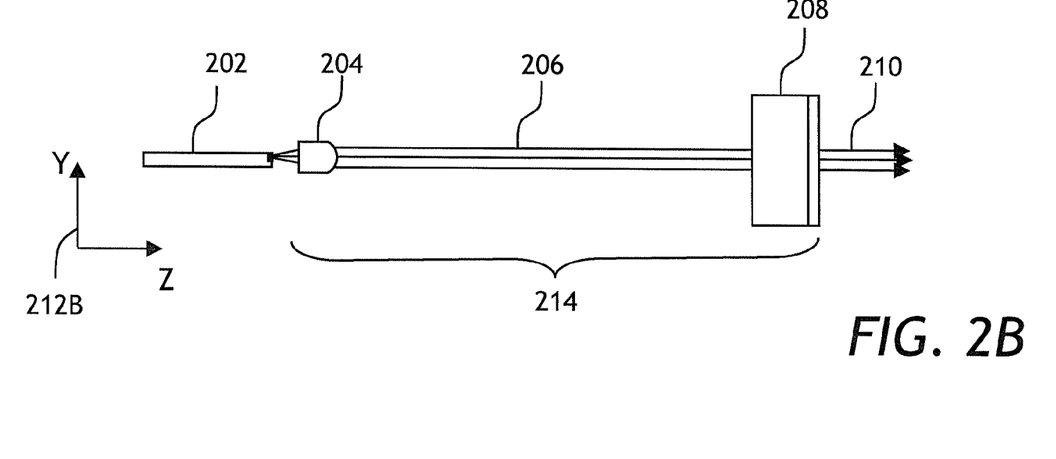

FIGS. 2A and 2B illustrate a basic optical configuration, in plan and side views, respectively, for collimating radiation from individual laser diode emitters, employed in the apparatus of present invention. A planar semiconductor laser diode 202 disposed in an XZ plane 212A emits an optical beam 206 that is collimated in an YZ plane 212B by a fast-axis collimating lens 204. The lens 204 can be cylindrical, or, more generally, toroidal in shape, such that while the divergence of beam 206 in YZ plane 212B is minimized, the divergence of beam 206 in XZ plane 212A is nearly unaffected. The beam 206 propagates towards a slow-axis collimating lens 208, which can also be cylindrical or toroidal. The function of lens 208 is to collimate the beam 206 in XZ plane 212A, such that an output beam 210 is collimated in both planes; XZ plane 212A and YZ plane 212B.

By selecting suitable focal length ratios of lenses 204 and 208 of an anamorphic telescope 214, a skilled artisan can reformat the beam profile emitted by the emitter 202, so as to arrive at shape and size of the beam profile suitable for application in the diode laser assembly of present invention, as described below.

Figure 3A:
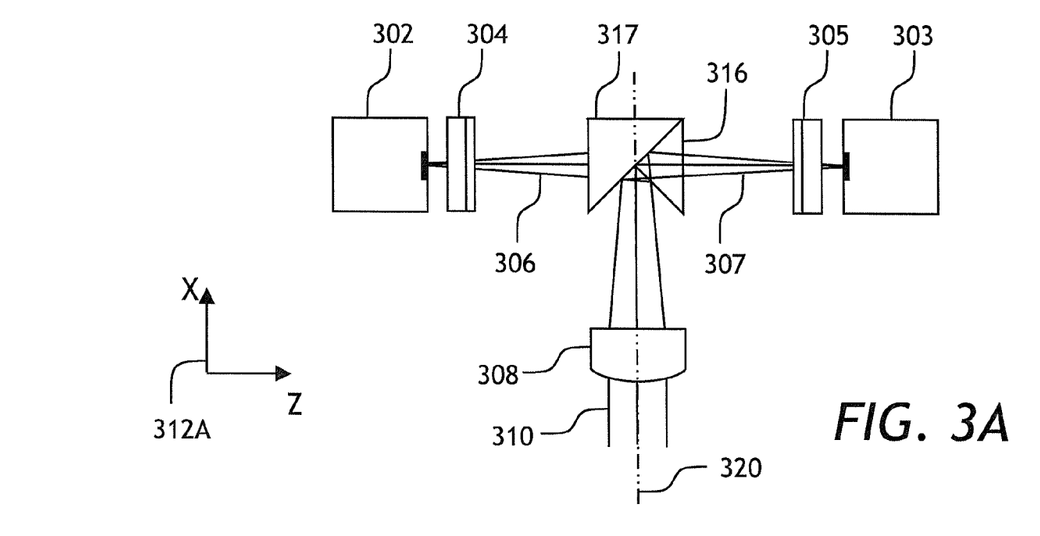
FIGS. 3A, 3B depict a layout of a basic two-emitter optical unit according to the present invention.
Figure 3B:
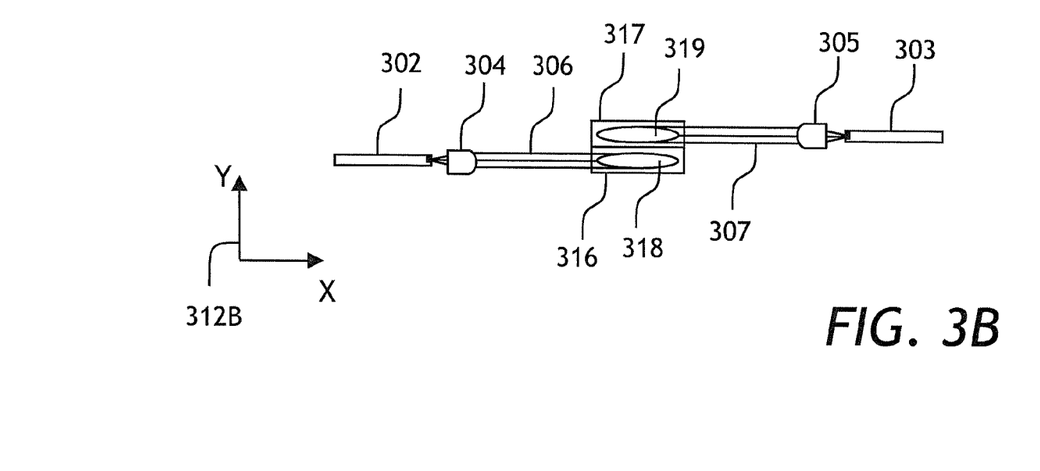

Turning now to FIGS. 3A and 3B, a configuration of a basic two-emitter optical unit, used as a building block of the assembly of present invention, is shown. FIG. 3A is a plan view, and a front view is shown in FIG. 3B. Two planar semiconductor laser diodes 302 and 303, disposed parallel to an XZ plane 312A but offset along an Y-axis 312B as is seen in FIG. 3B, emit optical beams 306 and 307 collimated along Y-axis 312B by fast-axis collimating lenses 304 and 305, respectively. The beams 306 and 307 are deflected by mirrors 316 and 317, which are arranged on the top of one another, so as to direct the beams 306 and 307 towards a slow-axis collimating lens 308. The spot profiles of anamorphic beams 306 and 307 on mirrors 316 and 317 are shown with ellipses 318 and 319, respectively, in FIG. 3B. After being collimated by the slow-axis collimating lens 308, the beams 310 are located one under another when viewed in the XZ plane 312A of FIG. 3A.

One can see that the arrangement of FIGS. 3A and 3B is similar to that of FIGS. 2A and 2B in a sense that both arrangements use an anamorphic telescope such as telescope 214, to reformat and collimate radiation of a laser diode, with the difference being that a folding mirror is used between the two lenses of a telescope in FIGS. 3A and 3B. The advantage of arrangement of FIGS. 3A and 3B, besides sharing the common optical element 308, is that it effectively utilizes the area on both sides of optical axis 320 of the slow-axis collimating lens 308 while effectively heat-sinking laser diodes 302 and 303. Another advantage is that output beams 310 from laser diodes 302 and 303 can be aligned independently: first, the fast-axis collimating lens 304 and folding mirror 316 for laser diode 302 are aligned and fixed, and then the optics 305 and 317 for laser diode 303 are aligned, and fixed. Yet another advantage of the arrangement shown in FIGS. 3A and 3B is that it can be used as a building block for adding more and more laser diode pairs into the same optical package, as is described below.

Figure 4A:
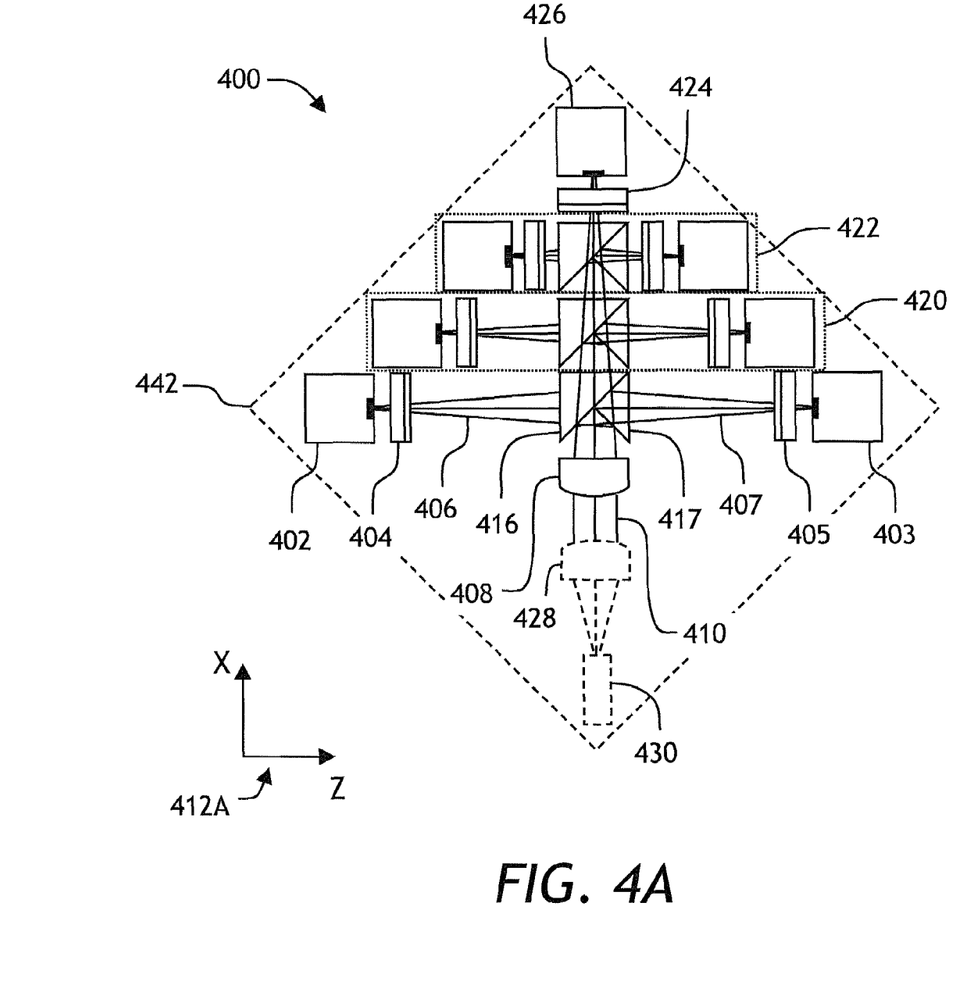
FIG. 4A is a plan view of the light source according to the present invention.

In FIG. 4A, a schematic layout of a diode laser 400, consisting of seven individual planar laser diode emitters, is shown. Of these seven emitters, two emitters 402 and 403, disposed parallel to an XZ plane 412A, emit optical beams 406 and 407 collimated in a fast-axis plane by fast-axis collimating lenses 404 and 405, respectively. The beams 406 and 407 are deflected by mirrors 416 and 417, which are arranged on top of one another, so as to direct both beams 406 and 407 towards a slow-axis collimating lens 408. After being collimated by the slow-axis collimated lens 408, the beams 410 are located one under another when viewed in the XZ plane 412A of FIG. 4A. As one can see, the arrangement so far is very similar to that of FIG. 3A. However, in FIG. 4A, two more pairs of laser diodes, associated with respective fast-axis collimating optics and folding mirrors, are present in the layout of the laser 400. The location of these two additional pairs of diodes is marked with dotted boxes 420 and 422. Boxes 420 and 422 encompass the same set of elements as the group of elements 402, 404, 406, 416, 417, 407, 405, and 403. Finally, one more laser diode chip 426, coupled to a fast-axis collimating lens 424, is shown at the top of FIG. 4A. The radiation of diode 426, collimated in the fast axis direction by lens 424, is coupled to the slow axis collimating lens 408, without any intermediate mirror whatsoever. One can see, by comparing FIGS. 2A and 2B to FIG. 4A, that the lenses 424 and 408 form an anamorphic telescope similar to the telescope 214 of FIGS. 2A and 2B.

The laser diode chips in boxes 420 and 422 are located closer to respective folding mirrors than lasers 402 and 403 since the distances between a laser diode chip emitting end and the common slow-axis collimating lens 408 are chosen to be equal. In this way, the slow-axis collimating condition will be fulfilled for all the laser diodes simultaneously. A focusing lens 428 can now focus the radiation from all laser diodes into an optical fiber 430.

Figure 4B:
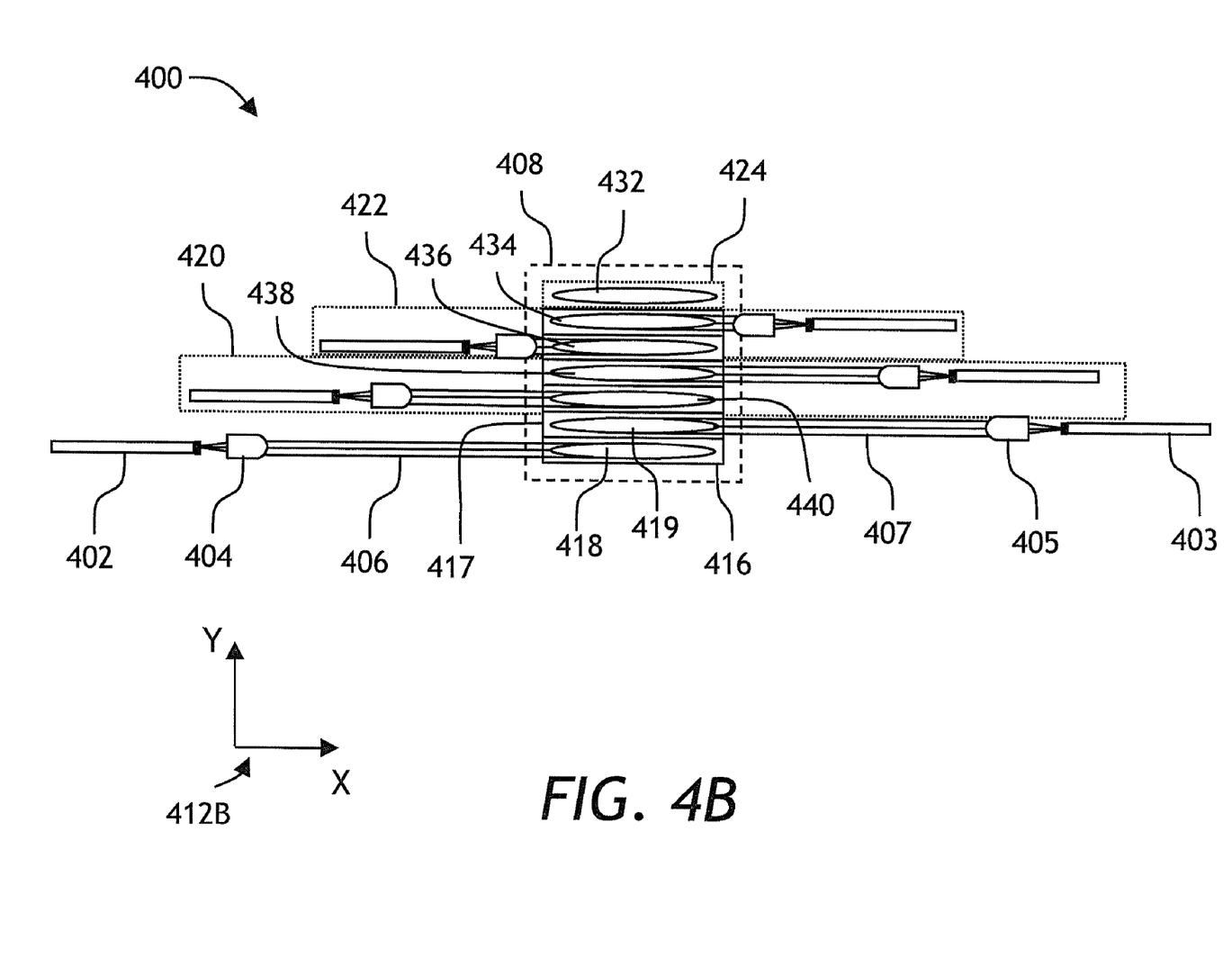
FIG. 4B is a front view of the light source according to the present invention.

Turning now to FIG. 4B, a schematic view of the diode laser 400 is shown in a front-view XY plane 412B. Two planar semiconductor laser diodes 402 and 403 emit optical beams 406 and 407 collimated along a Y-axis of the coordinate system 412B by fast-axis collimating lenses 404 and 405, respectively. The beams 406 and 407 are deflected by mirrors 416 and 417, which are arranged on top of one another, so as to direct both beams 406 and 407 towards the slow-axis collimated lens 408 shown in a plan view. The spot profiles of anamorphic beams 406 and 407 on mirrors 416 and 417 are shown with ellipses 418 and 419, respectively. The two other pairs of laser diodes associated each with a fast axis collimating lens and a folding mirror, are shown schematically inside boxes 420 and 422. In the view of FIG. 4B, these pairs of laser diodes are disposed one on a top of the other. The laser diode chip 426 of FIG. 4A emits light collimated in Y-direction by a fast-axis collimating lens 424. An ellipse 432 represents a lateral beam profile of the beam collimated in fast axis direction by the lens 424. Analogously, ellipses 434-440 represent lateral beam profiles of the fast-axis collimated optical beams from the other laser diode chips of the diode laser 400. By choosing the focal lengths of the lenses and the distances between the lenses and between a fast-axis collimating lens and a laser diode chip, one can design the ellipses 418, 419, and 432-440 to fill the aperture of the slow-axis collimating lens 408. For example, for a square clear aperture of the slow-axis collimating lens 408, the ellipse axis ratio should be approximately equal to 1/n, where n is the amount of laser diode chips in the diode laser assembly 400.

One can see that the arrangement allows for very compact packaging of laser diode chips and associated optics into a rhombic package 442 of FIG. 4A. Since the laser chips of the diode laser 400 are disposed close to a perimeter of the rhomb 442, their thermal coupling to each other is minimal, and effective heat sinking to a common heat sink is optimized as a result. Moreover, the laser diode chips are conveniently located for serial connection, to reduce the maximum current supplied to the diode laser 400.

Figure 5A:
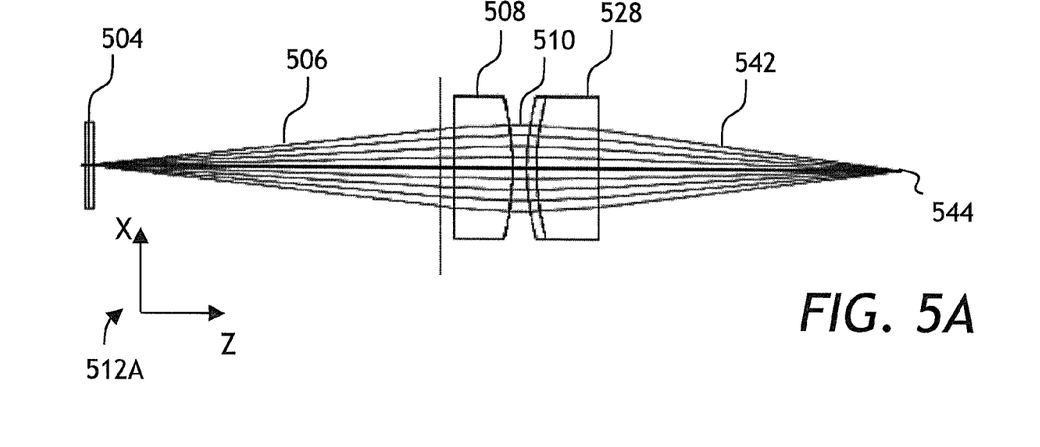
FIGS. 5A, 5B represent optical design software rendering of the optical beam paths in the light source according to the present invention.
Figure 5B:
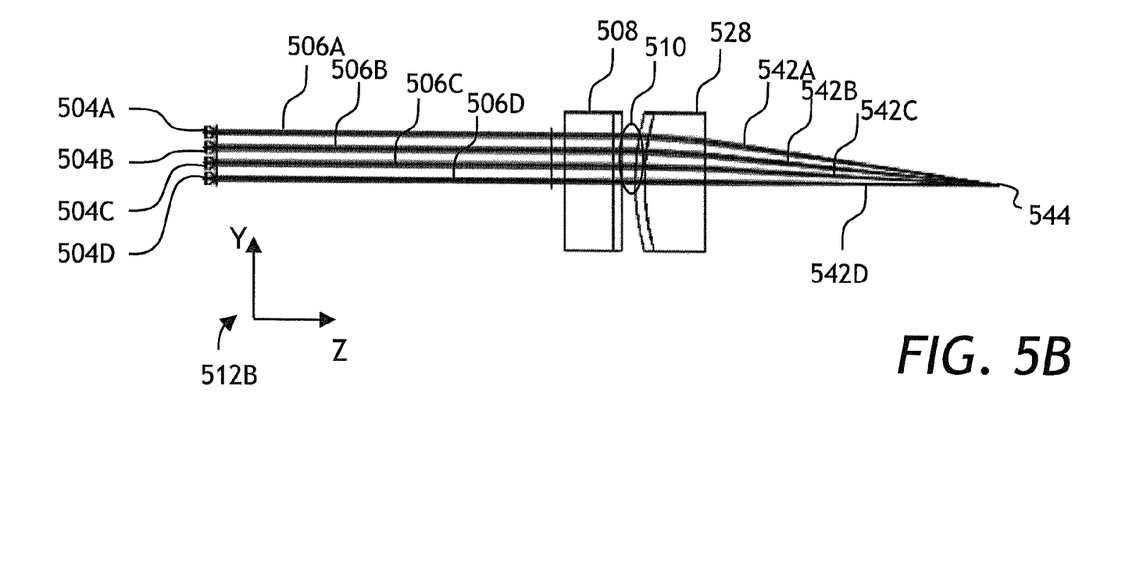

FIGS. 5A and 5B are optical design software renderings of the beam paths in an XZ plane 512A and an YZ plane 512B, respectively. Light from four emitters (not shown) is collimated in YZ plane 512B by cylindrical lenses 504A-504D seen as one lens 504 on FIG. 5A. Optical beams 506A-506D propagate towards a slow-axis collimating lens 508. The beams 506A-506D are seen as one beam 506 in FIG. 5A because the beams are propagating one under another being shifted along the Y-axis. Further, the slow-axis collimating lens 508 collimates the four beams 506A-506D, so that they propagate as a compound beam 510 towards a focusing lens 528 which focuses individual beams 542A-542D into a single spot 544. The folding mirrors are not shown in FIGS. 5A and 5B for simplicity.

Figure 6:
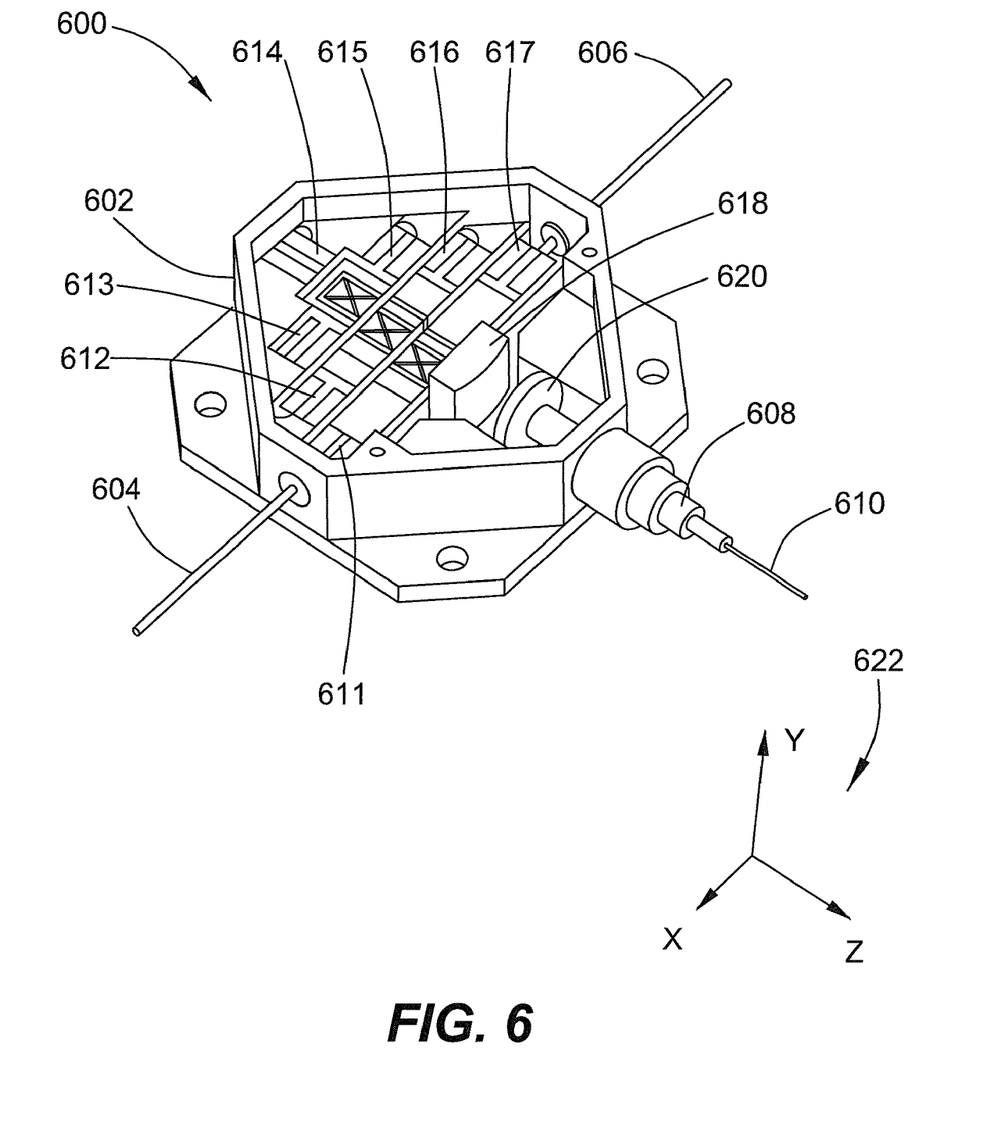
FIG. 6 is a 3D view of package of seven laser diode emitters.

FIG. 6 shows a 3D view of a prototype 600 of the fiber-coupled diode laser light source of present invention. It consists of a hermetically sealable package 602, which serves at the same time as a compound heat sink for seven laser diode single emitter chips 611-617. The single emitter chips are connected electrically in series, the driving current being supplied through terminals 604 and 606. A ferrule 608 holds an output optical fiber 610. Disposed in front of the fiber 610 are the focusing lens 620 and a slow-axis collimating cylindrical lens 618. Three pairs of folding mirrors are also seen in FIG. 6 as three X-like structures disposed behind the slow-axis collimating cylindrical lens 618, along the Z-axis, as indicated by a coordinate system 622. The mirrors are triangular glass plates polished and anti-reflection coated on the hypotenuse edge. These mirrors and the single emitter chips 611-617 are disposed with a step of 1 mm in the Y-direction. The footprint of the package 602 measures 45×45 mm. The fiber is a multimode fiber with a diameter of 105 microns and a numerical aperture of 0.22.

What is claimed is:

1. A light source comprising:

a plurality of planar emitters for emitting light, wherein an emission of each said emitter is characterized by a slow-axis divergence and a fast-axis divergence;

a plurality of fast-axis collimating means, one per each emitter, for collimating the emission of each emitter into a fast-axis collimated beam, wherein said fast-axis collimated beam continues to diverge in a slow-axis divergence plane;

a slow axis collimating means, disposed downstream of the fast-axis collimating means, for collimating the fast-axis collimated beams into a single collimated beam; and a plurality of redirecting means, for redirecting the fast-axis collimated beams, so as to couple said fast-axis collimated beams to the slow axis collimating means such that:

the fast-axis collimated beams are substantially parallel to each other and to an optical axis of the slow axis collimating means, the slow-axis divergence planes of the fast-axis collimated beams are substantially parallel to each other, and optical path lengths from the planar emitters to the slow axis collimating means are substantially equal, wherein the planar emitters are disposed on both sides of the optical axis of the slow axis collimating means.

2. A light source of claim 1 wherein the planar emitters are mutually offset from each other in a direction perpendicular to the slow-axis divergence planes.

3. A light source of claim 1 comprising a heat sink for removing heat from the planar emitters.

4. A light source of claim 1 wherein the planar emitters are individual laser diode emitter chips.

5. A light source of claim 1 wherein the planar emitters are laser diode array chips.

6. A light source of claim 1 further comprising a focusing means disposed downstream from the slow axis collimating means, for coupling the single collimated beam into an optical fiber.

7. A light source of claim 4 wherein the laser diode chips are connected in series.

8. A light source comprising:

a plurality of planar emitters for emitting light, wherein an emission of each said emitter is characterized by a slow-axis divergence and a fast-axis divergence;

a plurality of fast-axis collimating means, one per each emitter, for collimating the emission of each emitter into a fast-axis collimated beam, wherein said fast-axis collimated beam continues to diverge in a slow-axis divergence plane;

a slow axis collimating means, disposed downstream of the fast-axis collimating means, for collimating the fast-axis collimated beams into a single collimated beam; and a plurality of redirecting means, for redirecting the fast-axis collimated beams, so as to couple said fast-axis collimated beams to the slow axis collimating means such that:

the fast-axis collimated beams are substantially parallel to each other and to an optical axis of the slow axis collimating means, the slow-axis divergence planes of the fast-axis collimated beams are substantially parallel to each other, and optical path lengths from the planar emitters to the slow axis collimating means are substantially equal, wherein one of the emitters is disposed so that in operation, said emitter emits light propagating parallel to the optical axis of the slow axis collimating means, and said light does not strike any redirecting means.

9. A light source comprising:

a plurality of planar emitters for emitting light, wherein an emission of each said emitter is characterized by a slow-axis divergence and a fast-axis divergence;

a plurality of fast-axis collimating means, one per each emitter, for collimating the emission of each emitter into a fast-axis collimated beam, wherein said fast-axis collimated beam continues to diverge in a slow-axis divergence plane;

a slow axis collimating means, disposed downstream of the fast-axis collimating means, for collimating the fast-axis collimated beams into a single collimated beam; and a plurality of redirecting means, for redirecting the fast-axis collimated beams, so as to couple said fast-axis collimated beams to the slow axis collimating means such that:

the fast-axis collimated beams are substantially parallel to each other and to an optical axis of the slow axis collimating means, the slow-axis divergence planes of the fast-axis collimated beams are substantially parallel to each other, and optical path lengths from the planar emitters to the slow axis collimating means are substantially equal, wherein the planar emitters are substantially parallel to each other, and the redirecting means are flat mirrors attached by their side surfaces to each other, and wherein said side surfaces are parallel to each other and to the planar emitters.

10. A light source of claim 9 wherein the flat mirrors are mounted in crossed pairs so as to redirect light from a pair of planar emitters disposed on both sides of the optical axis of the slow axis collimating means.

11. A package of planar anamorphic emitters, comprising:

a two-emitter optical unit having first and second planar anamorphic emitters for emitting light, wherein the planes of said planar anamorphic emitters are oriented parallel to each other, and the first and the second emitters emit first and second beams, respectively, towards each other, and the first and second beams have a fast-axis divergence and a slow-axis divergence;

first and second fast axis collimating means, optically coupled to said first and second emitters, respectively, for substantially minimizing the fast-axis divergence of the beams emitted by the emitters, so as to produce first and second fast-axis collimated beams propagating towards each other; and first and second flat mirrors, optically coupled to said first and second fast axis collimating means, respectively, for re-directing the first and the second fast-axis collimated beams, so as to cause said beams to propagate in a same direction and parallel to each other;

a slow axis collimating means, disposed downstream of the two-emitter optical unit and optically coupled to both the first and the second fast-axis collimated beams of said two-emitter optical unit, for substantially minimizing the slow-axis divergence of the first and the second beams, so as to produce a collimated beam of light;

wherein optical path lengths from the first and the second emitters to the slow axis collimating means are substantially equal to each other.

12. A package of claim 11 additionally comprising a heat sink thermally coupled to said first and second emitters of said two-emitter optical unit.

13. A package of claim 11 wherein the emitters are disposed on both sides of an optical axis of the slow axis collimating means.

14. A package of claim 11 further comprising a third planar anamorphic emitter and a third fast axis collimating means optically coupled to said third emitter, for emitting a third fast-axis collimated beam in the same direction and parallel to both the first and the second fast-axis collimated beams located downstream from said first and second flat mirrors, respectively, such that the third fast-axis collimated beam is optically coupled to the slow axis collimating means without reflecting off a mirror, and is collimated by said slow axis collimating means, and such that optical path lengths from the first, the second, and the third emitters to the slow axis collimating means are substantially equal to each other.

15. A package of claim 12 wherein the flat mirrors are attached by their side surfaces to the heat sink, and/or to each other, and wherein said side surfaces are parallel to each other and to the planes of the first and the second planar emitters.

16. A package of claim 15 wherein the first mirror is mounted to the heat sink, and the second mirror is mounted to the first mirror, and projections of the mirrors onto a plane of the heat sink cross each other.

17. A package of claim 11 further comprising a focusing means disposed downstream from the slow axis collimating means, for coupling the collimated beam of light into an optical fiber.

18. A package of claim 11 comprising two said two-emitter optical units wherein all the emitters are oriented parallel to each other and offset relative to each other in a direction perpendicular to the planes of the planar emitters.

19. A package of claim 11 comprising three or more said two-emitter optical units wherein all the emitters are oriented parallel to each other and offset relative to each other in a direction perpendicular to the planes of the planar emitters.

20. A package of claim 16, comprising three said two-emitter optical units having six planar anamorphic emitters, and a seventh planar anamorphic emitter, wherein:
   all the emitters are oriented parallel to each other and offset relative to each other in a direction perpendicular to the planes of the planar emitters;
   optical path lengths from all emitters to the slow axis collimating means are substantially equal;
   the emitters are disposed on both sides of an optical axis of the slow axis collimating means, except for the seventh emitter; and
   the projections of the flat mirrors onto the plane of the heat sink cross each other at a substantially straight angle.

21. A package of claim 20 further comprising a focusing means disposed downstream from the slow axis collimating means, for coupling the collimated beam of light into an optical fiber.

22. A package of claim 11 wherein the planar emitters are individual laser diode emitter chips.

23. A package of claim 20 wherein the planar emitters are individual laser diode emitter chips.

24. A package of claim 22 wherein the laser diode emitter chips are connected in series.

* * * * *